US 6,608,328 B2

United States Patent
Kuo et al.

(10) Patent No.: US 6,608,328 B2
(45) Date of Patent: Aug. 19, 2003

(54) SEMICONDUCTOR LIGHT EMITTING DIODE ON A MISORIENTED SUBSTRATE

(75) Inventors: Li-Hsin Kuo, Taipei (TW); Bor-Jen Wu, Taipei (TW); Chin-Hao Hsu, Taipei (TW); Wen-Shyh Hsu, Tao-Yuan (TW)

(73) Assignee: Uni Light Technology Inc., Tao-Yuan (TW)

(*) Notice: Subject to any disclaimer, the term of this patent is extended or adjusted under 35 U.S.C. 154(b) by 0 days.

(21) Appl. No.: 09/776,743

(22) Filed: Feb. 5, 2001

(65) Prior Publication Data

US 2002/0104996 A1 Aug. 8, 2002

(51) Int. Cl.⁷ .............................................. H01L 27/15
(52) U.S. Cl. ........................ 257/79; 257/86; 257/94; 257/98; 257/101; 257/102; 257/103; 438/973
(58) Field of Search .......................... 257/79, 86, 87, 257/94, 96, 98, 101, 102, 103; 438/973

(56) References Cited

U.S. PATENT DOCUMENTS

| 5,027,169 A | * | 6/1991 | Takehashi et al. ............ 357/17 |
| 5,153,889 A | * | 10/1992 | Sugawara et al. ............ 372/45 |
| 5,469,458 A | * | 11/1995 | Numai ........................ 372/45 |
| 5,668,402 A | * | 9/1997 | Mochizuki et al. ......... 257/627 |
| 5,869,849 A | * | 2/1999 | Jou et al. ....................... 257/96 |
| 5,909,051 A | * | 6/1999 | Stockman et al. ........... 257/610 |
| 5,976,905 A | * | 11/1999 | Cockerill et al. ............. 438/36 |
| 6,046,464 A | * | 4/2000 | Schetzina ..................... 257/96 |
| 6,057,562 A | * | 5/2000 | Lee et al. ..................... 257/96 |
| 6,219,365 B1 | * | 4/2001 | Mawst et al. ................ 372/46 |
| 6,265,732 B1 | * | 7/2001 | Nakatsu et al. ............... 257/86 |

FOREIGN PATENT DOCUMENTS

| JP | 03203316 A | * | 9/1991 |
| JP | 07240560 A | * | 9/1995 |
| JP | 10178201 A | * | 6/1998 |

* cited by examiner

Primary Examiner—Nathan J. Flynn
Assistant Examiner—Remmon R. Fordé

(57) ABSTRACT

A light emitting diode is made by a compound semiconductor in which light is emitted from an active region with a multiple quantum well structure. The active region is sandwiched by InGaAlP-based lower and upper cladding layers. Emission efficiency of the active region is improved by adding light and electron reflectors in the light emitting diode. These InGaAlP-based layers are grown epitaxially by Organometallic Vapor-Phase Epitaxy (OMVPE) on a GaAs substrate with a misorientation angle toward <111>A to improve the quality and surface morphology of the epilayer and performance in light emitting. The lower cladding layer of first conductivity type forms on a misoriented substrate with the same type of conductivity. Light transparent and current diffusion layers with a second conductivity is formed on top of the upper cladding layer for the spreading of current and expansion of the emission light. These light transparent layers include a barrier layer, a lattice gradient layer, and a window layer with band gaps transparent to the emitting light.

28 Claims, 4 Drawing Sheets

SEMICONDUCTOR LIGHT EMITTING DIODE ON A MISORIENTED SUBSTRATE

BACKGROUND

1. Field of the Invention

The present invention generally relates to a method for forming a semiconductor light emitting diode, and in particular to a method for forming a compound semiconductor light emitting diode.

2. Description of the Prior Art

Light emitting diodes using a double heterostructure InGaAlP have been demonstrated in recent year. A typical double heterostructure InGaAlP device has a GaAs n type substrate on which several epitaxial layers are grown to form the light emitting diode. The InGaAlP-based alloy is an important semiconductor system for the fabrication of light emitting diode (LED) with very high luminescence emission at a wavelength between red and green region. The $In_{0.5}(Ga_{1-x}Al_x)_{0.5}P$ alloy is lattice matched to the GaAs substrate and has a direct transition of the bandgap with an energy range from 1.9 eV to around 2.3 eV with the Al composition of 0<x<0.7, where x designates the mole fraction of aluminum. The band gap of the $In_{0.5}(Ga_{1-x}Al_x)_{0.5}P$ alloy is indirect with a band gap energy range of 2.3 eV for x~0.7 and 2.35 eV for x~1.

For efficient light emission, one needs to work in the direct bandgap with a strong radiative recombination of carriers and high efficiency of light emitting. The InGaAlP-based LED with the shorter emission wavelengths between red and yellow-green visible color has a direct transition for the high brightness light emission. In addition, the $In_{0.5}(Ga_{1-x}Al_x)_{0.5}P$ alloy has a nearly perfect lattice alignment and is charge balance to the GaAs semiconductor substrate at the III-V/III-V interface which represents a good candidate for the epitaxial growth in an atomic-level, like precise control on the thickness and composition of the multiple quantum well (MQW). This leads to a good material quality of the heterostructure and epitaxial feasibility for a complicated and delicated device structure. Therefore, the quaternary $In_{0.5}(Ga_{1-x}Al_x)_{0.5}P$ alloy system attracts a great attention for the fabrication of high performance visible light-emitting diodes to improve the efficiency of light emitting diodes.

Figure 1:
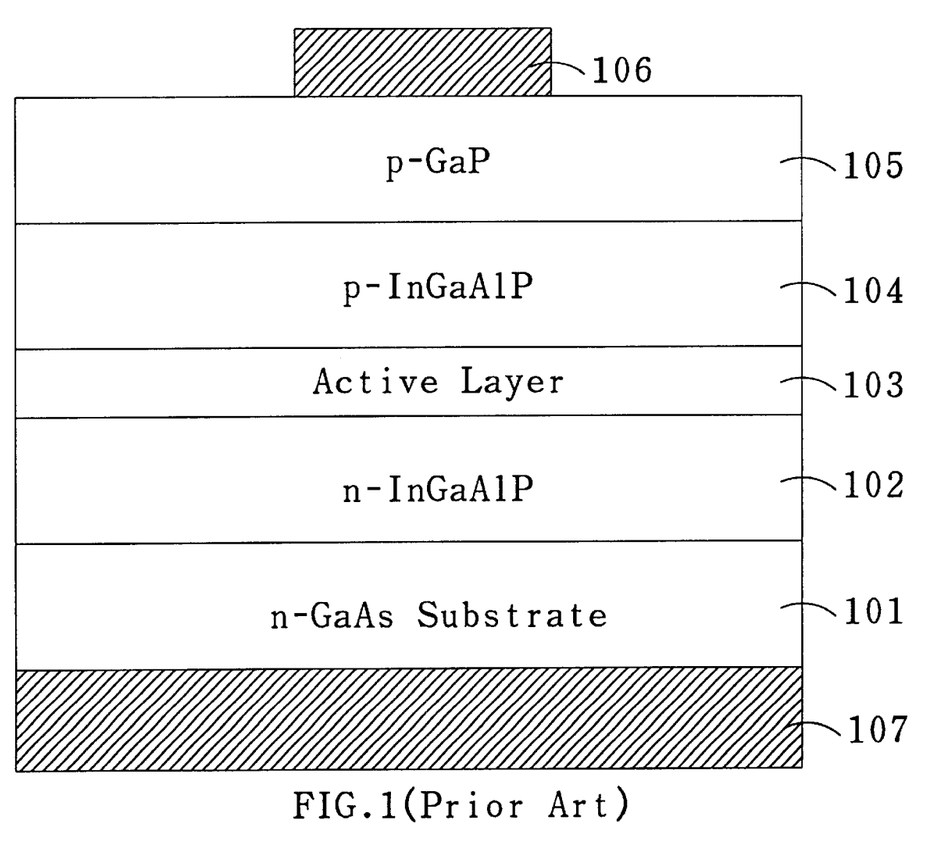
FIG. 1 shows a schematic cross-sectional diagram of a conventional double heterostructure light emitting diode.

FIG. 1 shows a schematic diagram of a conventional device structure of a light emitting diode. In this figure, the device structure comprises a double heterostructure (DH) with the quaternary $In_{0.5}(Ga_{1-x}Al_x)_{0.5}P$ alloy system grown on a n type GaAs substrate 101. The DH is constructed by an n-type $In_{0.5}(Ga_{1-x}Al_x)_{0.5}P$ lower cladding layer 102, an undoped $In_{0.5}(Ga_{1-x}Al_x)_{0.5}P$ active layer 103, a p-type $In_{0.5}(Ga_{1-x}Al_x)_{0.5}P$ upper cladding layer 104, a p-type GaP or p-type AlGaAs current spreading layer 105, a top metal contact 106, and a bottom metal contact 107.

In FIG. 1, the LED is a p-n junction with a forward bias to inject holes from a p-type cladding layer 104 and electrons from a n-type cladding layer 102 into an active region 103. The active layer 103 emits visible light due to the recombination of the electrons and holes in this region. Electrons and holes are injected as minority carriers across the active region 103 and they recombine either by radiative recombination or non-radiative recombination. The emitting wavelength of the InGaAlP-based LED can be adjusted by changing the Al composition of the $In_{0.5}(Ga_{1-x}Al_x)_{0.5}P$ alloy in the active layer 103, having a right energy gap to meet a specific wavelength of emission light. For instance, a shorter wavelength such as in yellow or yellow-green color requires a higher Al composition in the $In_{0.5}(Ga_{1-x}Al_x)_{0.5}P$ active layer 103 for light emission. The thickness of the active layer 103 is critical, and is normally less than the injected carrier diffusion length for the carrier recombination. The efficiency of the light emission is reduced in a thick active region due to a low carrier density. A typical thickness of the active region is around 0.3 to 0.5 μm. The active region is an area for the carrier injection and recombination to generate light. The requirement on material quality in the active region is very high for achieving a high efficient light emission. This requires a very low background of intrinsic impurity in the active region which may reduce the concentration of non-radiative recombination center. A high doping background of the active region is mainly contributed from a high density of deep traps in the active region which may cause nonradiative recombination in the process of light emission. A clean and low impurity reaction in the reaction chamber is essential for the growth of the active region. Typically, the $In_{0.5}(Ga_{1-x}Al_x)_{0.5}P$ active layer 103 is an undoped layer, either n or p-type, with a doping concentration of $5*10^{15}$ to $1*10^{17}/cm^2$. On the other hand, the background of the doping level is increased with an increase in the composition of Al in the active region. This is due to an increase on the impurity level at a higher Al concentration in the active region. For a shorter emission wavelength, therefore, the increase of Al composition in the active region associates with a reduction on the internal quantum efficiency of emission light. As described above, a higher Al concentration in the active region associates with an increase on the deep level causing non-radiative recombination in the light emitting layer that decrease the efficiency of the light emission.

The n-type and p-type cladding layers provide a source of injection carriers and have an energy gap higher than that of the active layer 103 for the confinement of the injecting carriers and emitting light. These cladding layers require a good conductivity and suitable doping concentration to supply enough injected carriers into the active region to achieve a high efficiency in light emission. The thickness of the $In_{0.5}(Ga_{1-x}Al_x)_{0.5}P$ layer 102 should be thick enough to prevent the carriers in the active region from flowing back to the cladding layers, but not too thick to affect the emission efficiency of the LED. As a result, a large portion of injected carriers overflow into the cladding layers, and current leakage occurs due to the non-radiative recombination of these overflow carriers. Consequently, the radiation efficiency in the conventional LED containing double heterostructure (DH) degrades as the wavelength of the device becoming shorter.

Following the p-type cladding layer 104, there is a current diffusion layer 105 for spreading out the emitting light efficiently. The current spreading layer 105 requires a semiconductor to be transparent to the wavelength of the emission light from the active region. The previous discussions are the prior art structure of the traditional light emitting diodes. In addition, the window layer needs to spread current efficiently into the active layer and cladding layer which requires a high doping level and a thick window layer.

To overcome the problem mentioned above, the LED must be designed functionally so that the emission light can be extracted out of the light emitting diode as much as possible to increase the light efficiency. In this invention, several claims in the InGaAlP-based LED are listed below for fabricating an efficient light emitting diode.

SUMMARY

It is an object of the invention to provide a method for manufacturing a high-efficiency light emitting diode;

Because the energy bands within the material depend on the material and its doping, the energy transition, and thus the color of the radiation it produces, is limited by the well-known relationship (E=hv) between the energy (E) of a transition and the frequency (v) of the light it produces.

The present invention provides a method to emphasize the growing process such as the AlGaAs-based light re-emitting layer, the InGaAlP-based light emitting layer and the GaP-AlGaP or AlGaAs-based window layer are grown epitaxially by Organometallic Vapor-Phase Epitaxy (OMVPE) on a tilted GaAs substrate with a misorientation toward <111>A with a wavelength between 560 and 650 nm.

In addition, the insertion of an electron reflector layer containing $In_y(Ga_{1-x}Al_x)_{1-y}P/In_{0.5}(Ga_{1-x}Al_x)_{0.5}P$ superlattice structure, an InGaAlP-based lattice gradient layer for the improvement of quantum efficiency of light emission, and film quality of $In_{0.5}(Ga_{1-x}Al_x)_{0.5}P/GaP$ heterostructure are also utilized to the light emitting diode.

The efficiency of the light emitting diode also depends on the alignment of p-n junction which is related to the doping levels and profiles of the n-type and p-type cladding layers. A gradient doping profile or a doping profile with a lower doping level near the multiple quantum well (MQW) and a higher doping level away from the MQW for a better alignment of the p-n junction are also proposed in this invention.

Furthermore, a 0.2–0.6% tensile stress in the MQW is claimed in this invention for a better efficiency of the light emitting diode.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The emitting color of the InGaAlP-based LED can be adjusted by changing the Al composition of the $In_{0.5}(Ga_{1-x}Al_x)_{0.5}P$ alloy in the active layer, having a right energy gap to meet a specific wavelength of emission light. The $In_{0.5}(Ga_{1-x}Al_x)_{0.5}P$ alloy in the active region tends to have ordered structures leading to a decrease on the width of the band gap. A higher concentration of Al in the active region is required to obtain the same desirable emission wavelength which associates with a higher density of impurities in the active region resulting in a lower luminescence efficiency. The origin of the ordered structures like atomic ordering or composition modulation in the semiconductor thin films arises from a localized variation in the tetragonal distortion of the lattice by the static displacement of atoms]. In $In_{0.5}(Ga_{1-x}Al_x)_{0.5}P$ alloy system, Indium(In) has a larger tetrahedral covalent radius than Galium(Ga) or Aluminum (Al) atom. Thus, it is possible that the difference in the tetrahedral covalent radii produces clustering of like species which in turn introduce local dilations and contractions of the lattice. From the thermodynamic concept of spinodal decomposition, an alloy with a certain composition located in the miscibility gap of a phase diagram has an order-disorder transformation at a transition temperature. The difference for the experimental results and the predication from the thermodynamic concept may be due to a consideration in kinetic energy and surface structure for the formation of the ordered structures. From our experiments, the $In_{0.5}(Ga_{1-x}Al_x)_{0.5}P$-based thin film follows basic rule of the spinodal decomposition and tends to have a different degree of ordered structure for a growth temperature near 650 to 770° C. The light emitting diode is epitaxial deposited at a growth temperature higher than 700° C. and this special characteristic is claimed in this invention.

On the other hand, the reconstructed surface of the [001] GaAs substrate has alternating tensile and compressive regions in the subsurface layer developing along the [110]-type direction. Since Indium has a larger tetrahedral covalent radius than Galium or Aluminum, the alternating tensile and compressive rows on the growing surface are energy favorable nucleation sites for the occupation of Indium and Galium or Aluminum atoms, respectively. This implies that the formation of the ordered structure is also strongly related to the surface structure of the substrate in addition to the factor of order-disorder transition temperature. From our experiments, the degree of ordering can be changed or reduced significantly using a GaAs substrate with a different miscut angle. The order-disorder transition temperature is reduced due to an increase in miscut angle on the GaAs surface. On the surface of the miscut substrate, the areas of surface reconstructions with the periodical dilation and contraction have been changed and reduced due to the increase on the miscut angle of the substrate. As a result, the degree of atomic ordering in the $In_{0.5}(Ga_{1-x}Al_x)_{0.5}P$ layer has been reduced greatly by increasing the miscut angle of GaAs substrate. At a growth temperature, the ordered structure in the $In_{0.5}(Ga_{1-x}Al_x)_{0.5}P$ alloy is considered to be a factor to lose quantum efficiency due to an increase of the Aluminum concentration in the $In_{0.5}(Ga_{1-x}Al_x)_{0.5}P$-based active region for obtaining a certain band width of the quantum well. Therefore, the order-disorder transition temperature can be reduced in a $In_{0.5}(Ga_{1-x}Al_x)_{0.5}P$-based epitaxy grown on a off-cut substrate.

In addition, the quantum efficiency of the Aluminum containing $In_{0.5}(Ga_{1-x}Al_x)_{0.5}P$-based multiple-quantum wells can be improved by increasing the substrate misorientation. On a growing surface, the increase on the off-cut of the GaAs substrate toward <111>A surface exposed more cation-terminated step edges. The incorporation of adsorbed impurities is via step trapping and depends on the bonding geometry between the adsorbed impurities and the terminated steps on the growing surface. The cation-terminated step has a single bond and provides a weak adsorption site. Thus, the step trapping efficiency decreases as the misorientation of the growing surface increases toward <111>A. Therefore, the incorporation of impurity (such as silicon or oxygen) species in the active region decreases as the misorientation angle increases. Those impurities such as oxygen can act as deep levels and non-radiative recombination centers in the light emitting region(LED), that affects the light emitting efficiency in LED. In this invention, a GaAs substrate with a misorientation angle equal or higher than 10 degree toward <111>A is also claimed in this invention to obtain a better efficiency of the emitting light.

Furthermore, the quality and smoothness of the film are improved with an InGaAlP-based LED structure grown on a misoriented GaAs substrate. A process for improving the smoothness of the semiconductor layers grown by epitaxial tools like liquid phase epitaxy (LPE) or chemical vapor deposition (CVD) has been claimed in an expired patent for the improvement of the film smoothness. In the current invention, the InGaAlP-based LED structure is grown on a off-cut GaAs substrate with a misorientation angel larger than or equal to ten degrees by Organometallic Vapor-Phase Epitaxy (OMVPE) to improve the film's smoothness. From our studies, the smoothness of the LED structure increases as the misorientation angle of the substrate increases.

The improvement on surface smoothness using a misoriented substrate is especially significant on the growth of III-V mismatch heterostructure such as GaP, AlGaP, and InGaAlP-based epilayers grown on a GaAs substrate for the current LED application. The lattice mismatch between those epilayer (GaP, AlGaP, or InGaAlP alloy) and the GaAs substrate is around 0–3.6% depending on the alloy composition in the window it layer. In deposition of a film on a mismatch substrate, the initial nucleation stage of the film tends to form islands on the substrate and the size of these islands increase as the mismatch between film and substrate increases. This leads to the formation of a high density of threading dislocations in the films and gives rise to an increase on the surface roughness of the depositing film. The high density of the crystalline defects and rough film's surface can be improved with an increase on the surface nucleation sites, a decrease on the size of the nucleation islands, and a gradient change of the lattice constant in the mismatch heterostructure. An increase in film's nucleation sites and decrease in size of the nucleation islands are achieved and claimed in this invention using a misoriented GaAs substrate with an off-cut angle larger than or equal to ten degrees and inserting an InGaAlP-based intermediate layer between the window layer and the $In_{0.5}(Ga_{1-x}Al_x)_{0.5}P$-based LED epilayer.

In the off-cut substrate, the step edges on the substrate increase as the misorientation angle of the substrate increases. Those step edges provide low energy sites for the nucleation of the depositing films. Therefore, from the thermodynamic point of view, a high density of small islands nucleated on a off-cut substrate leading to an increase on the film's quality and smoothness. The improvement on the film's quality may increase the output efficiency of the emitting light in LED.

In addition, the smoothness on the film's surface may increase the process window of device processing such as contact fabrication and packaging of the light emitting diodes. The improvement on film's quality, efficiency of emitting light, and process window of device fabrication is achieved and claimed in this invention by means of depositing $In_{0.5}(Ga_{1-x}Al_x)_{0.5}P$-based LED structure on a off-cut GaAs substrate with a misorientation angel larger than or equal to ten degrees($\geq 10°$).

Figure 2:
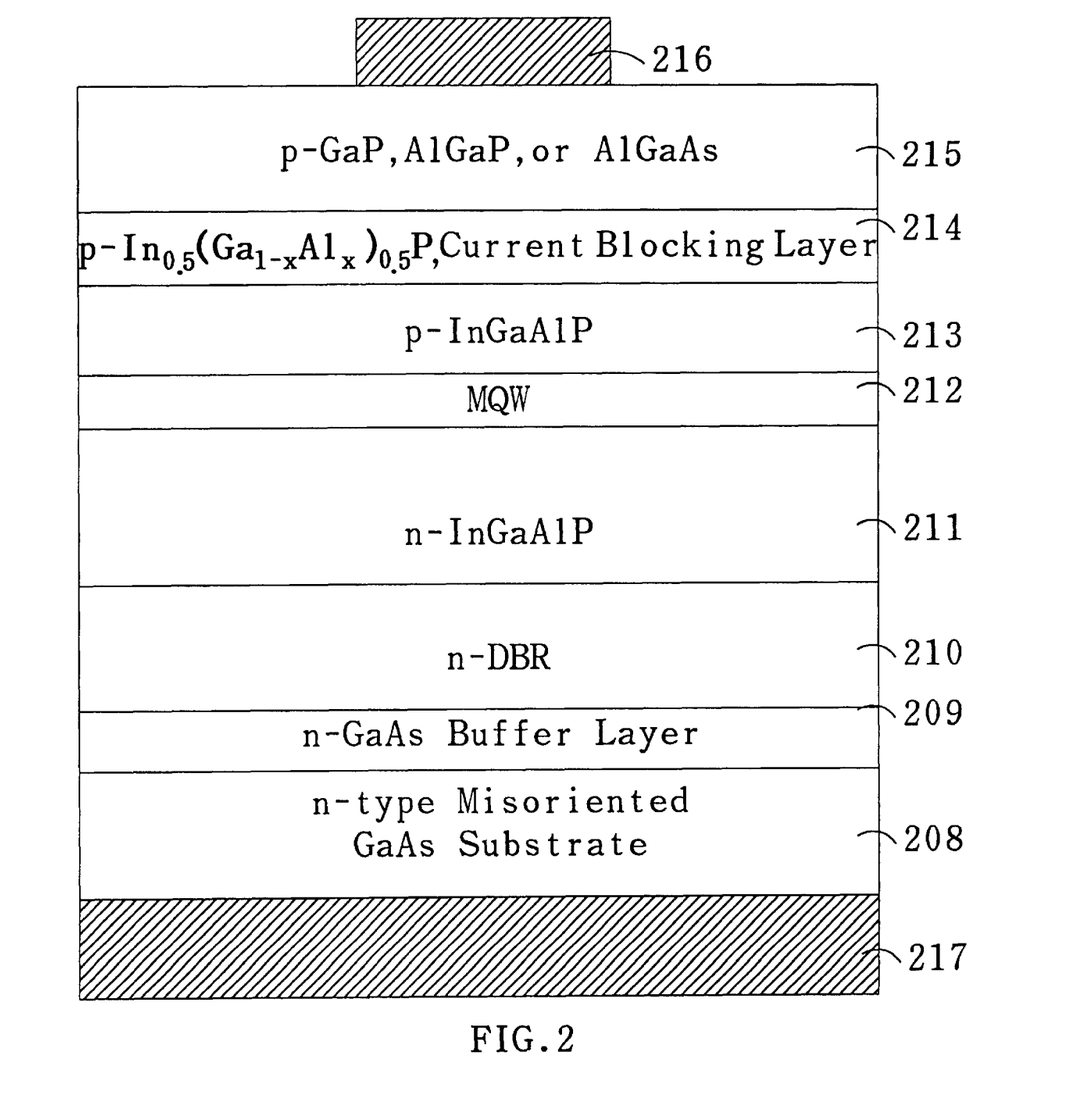
FIG. 2 shows a schematic cross-sectional diagram of a first embodiment of a light emitting diode according to the present invention.

FIG. 2 shows a schematic cross-sectional diagram of a device structure of a light emitting diodes from the bottom to the top of the emitting diode which comprises:

a light re-emitting layer 210 and a quaternary $In_{0.5}(Ga_{1-x}Al_x)_{0.5}P$ alloy grown on a n-type misoriented GaAs substrate 208, a n-type GaAs buffer layer 209 is constructed on the n-type GaAs substrate 208, followed by an n-type $AlAs/Al_xGa_{1-x}As$ or $In_{0.5}(Ga_{1-x}Al_x)_{0.5}P$ based distributed Bragg reflector (DBR) 210, a n-type $In_{0.5}(Ga_{1-x}Al_x)_{0.5}P$ lower cladding layer 211, a strained and undoped $In_y(Ga_{1-x}Al_x)_{1-y}P/In_{0.5}(Ga_{1-x}Al_x)_{0.5}P$ multiple quantum well 212, a p-type $In_{0.5}(Ga_{1-x}Al_x)_{0.5}P$ upper cladding layer 213, a thin $In_{0.5}(Ga_{1-x}Al_x)_{0.5}P$ intermediate barrier layer 214, a p-type GaP, AlGaP or AlGaAs current spreading layer 215, a top metal contact 216, and a bottom metal contact 217.

The LED structure in FIG. 2 is very similar to the conventional double heterostrucure in FIG. 1 except that the InGaAlP-based active region 103 in FIG. 1 is replaced by a strained $In_y(Ga_{1-x}Al_x)_{1-y}P/In_{0.5}(Ga_{1-x}Al_x)_{0.5}P$ multiple-quantum well 212 in FIG. 2. A light re-emitting layer of n-type $AlAs/Al_xGa_{1-x}As$, $AlAs/In_{0.5}(Ga_{1-x}Al_x)_{0.5}P$, or $In_{0.5}(Ga_{1-x}Al_x)_{0.5}P$ based DBR 210 is placed on bottom of the $In_{0.5}(Ga_{1-x}Al_x)_{0.5}P$ layer 211 for the light reflection. In addition, a p-type $In_{0.5}(Ga_{1-x}Al_x)_{0.5}P$ barrier layer 214 is inserted between the p-type $In_{0.5}(Ga_{1-x}Al_x)_{0.5}P$ cladding layer 213 and the p-type GaP, AlGaP, or AlGaAs window layer 215.

In FIG. 2, the LED structure is grown on a Silicon doped misoriented GaAs substrate 208 with a 0.2 to 0.5 $\mu m$ Silicon doped GaAs buffer layer 209. The GaAs buffer layer 209 is applied to improve the smoothness and uniform surface structure on the GaAs 208 growing surface. Growth of the GaAs buffer layer 209 is essential to obtain a better film's quality with sharp heterointerfaces including the multiple-quantum wells 212 in the LED structure. Following the GaAs buffer layer 209, a distributed Bragg reflector (DBR) 210 is grown on the GaAs buffer layer 209 for the purpose of light re-emitting. This light re-emitting layer is made from a material whose prohibited band height is very close to the active region. The materials selection of the light re-emitting layer requires to consider lattice matching, band gap and the difference in reflective index, and doping limit of individual reflecting layer. Typically, a ten to twenty period of distributed Bragg reflector 210 can bring the external quantum efficiency of emitting light up to 1.5 times in brightness of the LED without DBR 210.

In $AlAs/Al_xGa_{1-x}As$ n type DBR 210, the wavelength $\lambda$ of reflection is determined by the thickness d of the individual reflecting layer with a function of $d=\lambda/4n$ where n is the reflection index of the individual layer in DBR 210 at a reflection wavelength $\lambda$. The purpose of the n type distributed Bragg reflector (DBR) 210 is to reflect the emitting light from an active region, the bandgap of the $Al_xGa_{1-x}As$ has to be larger than that of the active region to prevent any light adsorption. In addition, the difference in reflective index between individual layer in DBR 210 needs to increase as much as possible to obtain a better efficiency of light re-emitting in DBR 210. However, the light re-emitting DBR 210 also acts as a transition layer for current injection which requires a high concentration of conducting carriers from our experiment the high concentration is above $2*10^{17}/cm^2$. Due to the intrinsic limitation of n-type doping in the AlAs-based DBR 210, a limited period of DBR 210 is expected to obtain a low forward operating voltage for achieving a reflectivity of DBR 210 is larger than or equal to 90 to 95 percents. Typically, the period of the light remitting DBR 210 in InGaAlP-based LED is around ten to twenty.

Another candidate used for the the light re-emitting DBR 210 is the $In_{0.5}(Ga_{1-x}Al_x)_{0.5}P$-based alloy which can achieve a higher conductivity than the AlAs/AlGaAs-based DBR 210. However, the higher doping capability is a trade-off on the control of lattice matching in $In_{0.5}(Ga_{1-x}Al_x)_{0.5}P$-based DBR 210 grown on a GaAs substrate 208.

In FIG. 2, the purpose of the n-type $In_{0.5}(Ga_{1-x}Al_x)_{0.5}P$ lower cladding layer 211 is for the carrier injection into the active region and carrier confinement in the active region. The composition of the Aluminum in the n-type $In_{0.5}(Ga_{1-x}Al_x)_{0.5}P$-based cladding layer 211 is of $0.7<x<1$ depending on the emission wavelength of the active layer. Thickness of the n-type cladding layer 211 should be thicker than the diffusion length of the injection carriers to prevent the carrier diffusion from the active region 212 into the cladding layer. A typical thickness of the n-type $In_{0.5}(Ga_{1-x}Al_x)_{0.5}P$ lower cladding layer 211 is 0.3 to 0.8 $\mu$m. In this invention, the doping level of the n-cladding layer 211 has a gradient doping profile or a two-step doping profile in a range of the carrier concentration from $4*10^{17}/cm^2$ to $1*10^{18}/cm^2$ in the n-type $In_{0.5}(Ga_{1-x}Al_x)_{0.5}P$ cladding layer 211.

The doping level of the p-cladding layer 213 having a gradient or a two-steps doping profile within a range of the carrier concentration of $4*10^{17}/cm^2$ to $1*10^{18}/cm^2$ is applied in this invention. The light-output of the LED is strongly dependent on the doping level and profile of n- and p-type cladding layers (211 and 213).

"Right" n- and p-type doping profiles in the $In_{0.5}(Ga_{1-x}Al_x)_{0.5}P$-based cladding layers (211 and 213) leading to a location of p-n junction in the active region (212) is essential for an efficient radiative recombination of electrons and holes in the multiple quantum wells (212) upon current injection. Any overflow of individual injection carriers would decrease the efficiency of the emitting light due to the misalignment of the p-n junction and creation of nonradiative recombination centers by inter-diffusion of dopants into the active region (212). A gradient or step doping profile in the p-type $In_{0.5}(Ga_{1-x}Al_x)_{0.5}P$-based cladding layer 213 with a thickness ratio of low/high doping level of 0.1 to 0.3 is applied in the current application to insure precise carrier recombination without creating any large voltage drop or carrier overflow in the cladding layer. A good light emitting device requires a higher doping level of the n- and p-type cladding layers (211 and 213) (0.75 to $1*10^{18}/cm^2$) away from the multiple quantum wells (212) and a lower doping level of n- and p-type cladding layers (0.4 to $0.75*10^{18}/cm^2$) near the multiple quantum wells (212).

Following the n-type $In_{0.5}(Ga_{1-x}Al_x)_{0.5}P$ cladding layer 211, a strained $In_y(Ga_{1-x}Al_x)_{1-y}P/In_{0.5}(Ga_{1-x}Al_x)_{0.5}P$ multiple-quantum well (MQW) 212 is inserted as an active layer between the n- and p-type cladding layers. The MQW 212 with an InGaAlP-based superlattice is applied in the present invention to increase the efficiency in the active region and reduce the composition of Al in the quantum wells for the emission at a short wavelength. The MQW 212 structure in LED leads to an increase on the efficiency of the emission light. The multiple quantum wells 212 are formed of a well with a narrow band gap and a barrier with a higher band gap.

As a result, the electrons and holes are quantized (confined) and unable to move freely in the direction of injection current. They can still move freely and recombine in the plane perpendicular to the direction of the injection current. In the $In_y(Ga_{1-x}Al_x)_{1-y}P/In_{0.5}(Ga_{1-x}Al_x)_{0.5}P$ Multiple quantum well 212, the confinement of the carriers at the conduction band pushes the effective conduction band up, and the confinement of the carriers at the valence band pushes the effective band edge downwards. The MQW 212 structure shifts the effective wavelength of the emission to a shorter wavelength. Thus, the usage of Al composition in the active region can be reduced greatly, so that, for a particular emitting wavelength, the MQW 212 structure in LED may increase the lifetime of the non-radiative recombination and reduce the absorption of the light emission. In addition, the total thickness of the $In_y(Ga_{1-x}Al_x)_{1-y}P/In_{0.5}(Ga_{1-x}Al_x)_{0.5}P$ multiple-quantum well 212 is of 50–150 nm in the current application which is less than the thickness of the active region (200 to 500 nm) in the double heterostructure. This leads to an increase on the densities of the injection carriers in the active region resulting in fast radiative recombination. Consequently, the multiple quantum well structure reduces the usage of Al composition and the carrier lifetime of the radiative recombination, so that the quantum efficiency increases greatly with a MQW 212 active region in this invention.

The Al molecular composition x of the $In_{0.5}(Ga_{1-x}Al_x)_{0.5}P$ alloy in the multiple-quantum well has a range of 0 to 0.3 from the red to yellow-green light emission and needs to conspire with the adjustment on the thickness and number of the quantum wells. In a direct bandgap of the $In_{0.5}(Ga_{1-x}Al_x)_{0.5}P$ alloy with x less than 0.3 in the MQW 212, the emission wavelength of the thin quantum well is greatly dependent on the thickness of the well. As the thickness of the well decreases in the MQW 212, the quantized carriers in the conduction band push the effective sub-band upwards and the carriers in the valance band push the effective sub-band downwards. The quantized band structure in the MQW 212 is sensitive at a certain range of well thickness from 1 to 10 nm. As a result, the emission wavelength of electron-hole recombination becomes shorter due to the quantized energy band structure. The typical total thickness of the wells and barriers are between 1 and 10 nm for the $In_{0.5}(Ga_{1-x}Al_x)_{0.5}P$ alloy obtained with a periodicity of 10 to 50 for the best light emission efficiency. On the other hand, the internal quantum efficiency of the light emission is also dependent on the thickness ratio of well to barrier. A typical value of the well/barrier thickness ratio is near 0.75 to 1.25 for efficient carrier recombination.

The lattice strain also plays an important factor for the design of Multiple-quantum well 212 in the LED. The biaxial strain in the MQW 212 structure can split the valence band degeneracy in the quantized band structure and this may affect the band structure and materials' optical and electrical properties of the films. Both the compressive and tensile stress may contribute to the increase on the light efficiency in the LED. The asymmetrical stress applied in the lattice of the MQW 212 is equal to have the same effect on the band gap structure and valence band splitting. For a compressive biaxial stress, the heavy hole (hh) band becomes a ground states with a lower effective mass character at the top of the valence band. The compressive stress may enhance the motion and recombination of carriers in the plane perpendicular to the direction of the injection current and leads to an increase on the internal quantum efficiency of the wells. On the other hand, a light hole (lh) band is the ground state for a tensile biaxial stress with a higher effective mass. Although the effective mass is large for a well under a tensile stress, the poorer k-space of the electron and hole distributions reduce the spontaneous emission efficiency and this may contribute to an increase on the internal quantum efficiency. Therefore, both the compressive and tensile stress in the MQW 212 contribute to an increase on the efficiency of light emission from the quantum wells. From our studies, the $In_y(Ga_{1-x}Al_x)_{1-y}P$-based multiple quantum wells 212 start to relax with a lattice mismatch greater than 1% between the MQW 212 and the rest of the LED structure. The lifetime test of the LED shows that device degraded easily with a lattice mismatch greater than 1%. This is due to the internal misfit stress involved in the heterostructure acting as a motive force for the generation of the misfit dislocations in the multiple quantum wells 212, and climb or glide of point defects during device fabrication and operation. The control on the compressive or tensile stress in the multiple quantum wells to 212 improve the efficiency of light output is limited to a range from 0.2 percents to 0.6 percents of the lattice mismatch between the $In_y(Ga_{1-x}Al_x)_{1-y}P$-based multiple-quantum wells 212 and the GaAs substrate 208. In the current application, the best output efficiency of the LED is obtained with a tensile stress (about 0.2 to 0.6 percents of lattice mismatch along the growth direction in the quantum wells.

Figure 3:
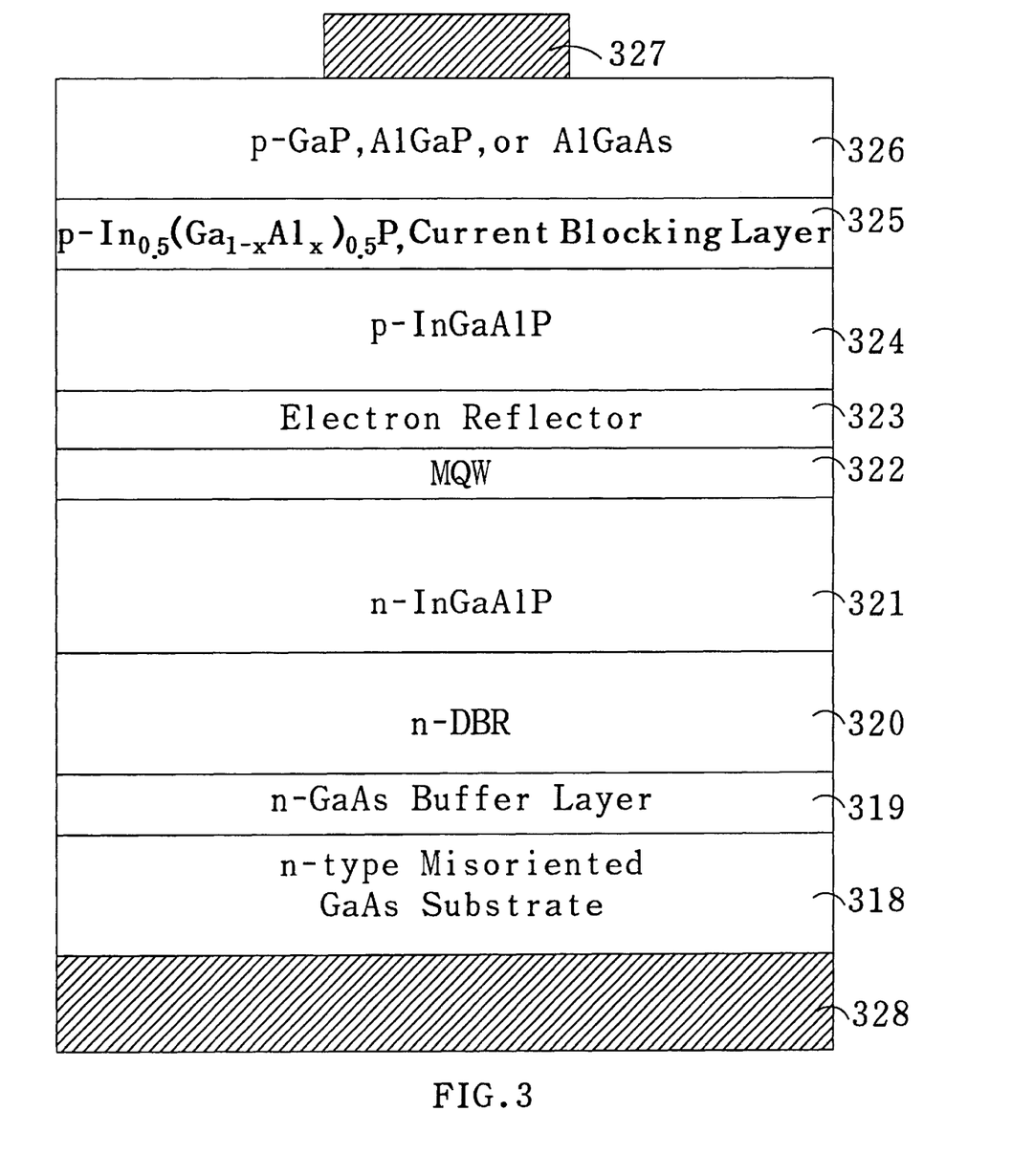
FIG. 3 shows a schematic cross-sectional diagram of a second embodiment of a light emitting diode according to the present invention.

FIG. 3 shows a schematic diagram of a device structure of light emitting diodes with a multiple-quantum barrier (MQB). In this figure, the device structure comprises a distributed Bragg reflector(DBR) 320 and a quaternary $In_{0.5}(Ga_{1-x}Al_x)_{0.5}P$ alloy layer 325 grown on a n-type GaAs misoriented substrate 318. The device structure is constructed by a GaAs buffer layer 319, an $AlAs/Al_xGa_{1-x}As$-$AlAs/In_{0.5}(Ga_{1-x}Al_x)_{0.5}P$- or $In_{0.5}(Ga_{1-x}Al_x)_{0.5}P$-based distributed Bragg reflector (DBR) 320, an $In_{0.5}(Ga_{1-x}Al_x)_{0.5}P$ lower cladding layer 321, a strain $In_y(Ga_{1-x}Al_x)_{1-y}P/In_{0.5}(Ga_{1-x}Al_x)_{0.5}P$ multiple quantum well (MQW) 322, an $In_y(Ga_{1-x}Al_x)_{1-y}P$-based electron reflector layer 323, a p-$In_{0.5}(Ga_{1-x}Al_x)_{0.5}P$ upper cladding layer 324, a thin $In_{0.5}(Ga_{1-x}Al_x)_{0.5}P$ intermediate barrier layer 325, a p-GaP, p-AlGaAs or p- AlGaP current spreading layer 326, a top metal contact 327, and a bottom metal contact 328.

In FIG. 3, a thin strained barrier 325 or a multiple-layer of electron reflector 323 is inserted in the p-cladding layer 324 to increase the barrier height of the cladding layer. The electron reflector 323 is also grown by OMVPE and requires a precise control on the interface sharpness, layer thickness, and composition. The thin strained barrier layer 325 has an energy gap equal or larger than the energy gap of the cladding layer 324 and is inserted near the active region 322 to avoid the overflowing of carriers into the cladding layer 324 for improving the efficiency of the light emission. The p-type $In_{0.5}Al_{0.5}P$ barrier layer of the electron reflector 323 is strained and located very near the active region 322 with an enough thickness and stress to avoid the electron tunneling from the active region 322. On the other hand, the multiple-layer superlattice of the electron reflector layer 323 is designed to reflect electrons with a thickness of individual layer equal to N/4 of the electron deBrogile wavelength, where N is an odd number. The maximum reflectivity of the electron reflector layer 323 is adjusted by the composition, thickness, and periodicity of the p-type $In_{0.5}(Ga_{1-x}Al_x)_{0.5}P/In_{0.5}Al_{0.5}P$ superlattice. The composition of the p-doped $In_{0.5}(Ga_{1-x}Al_x)_{0.5}P$ layer in the electron reflector 323 has the same composition as that in the undoped quantum well at the active region 322. The efficiency of light emitting from the active region 322 increases as periods of the $In_{0.5}(Ga_{1-x}Al_x)_{0.5}P/In_{0.5}Al_{0.5}P$ superlattice of an electron reflector 323 increase. This is due to an increase on the reflectivity of the electron reflector.

However, this behavior is more significant in an electron reflector with a gradient or steps increase on the thickness of individual $In_{0.5}(Ga_{1-x}Al_x)_{0.5}P$ layer within a range from 2 to 5 nm. A variety on the thickness of individual $In_{0.5}(Ga_{1-x}Al_x)_{0.5}P$ layer in the electron reflector layer 323 represents a variety of high electron reflection for a certain range of different incident electron energy from the active region 322. Therefore, the improvement on the carrier confinement of the "gradient or steps" electron reflector layer 323 is due to a flexibility to obtain high electron reflectivity for a certain range of different electron incident energy. The variety in electron reflection can be achieved by either a gradient or steps change in layer thickness. In this invention, an electron reflector 323 containing a strained barrier of $In_{0.5}Al_{0.5}P$ layer followed by an $In_{0.5}(Ga_{1-x}Al_x)_{0.5}P/In_{0.5}Al_{0.5}P$ superlattice is placed near the active region 322 to reflect the overflowing carriers from the active region 322. The strained barrier of $In_{0.5}Al_{0.5}P$ layer 325 has a thickness of 20 to 40 nm and the periodicity of the $In_{0.5}(Ga_{1-x}Al_x)_{0.5}P/In_{0.5}Al_{0.5}P$ superlattice is of 10 to 40. The thickness of individual layer in the $In_{0.5}(Ga_{1-x}Al_x)_{0.5}P/In_{0.5}Al_{0.5}P$ superlattice is around 2–5 nm. Within the thickness range (2–5 nm) of the individual layer in the $In_{0.5}(Ga_{1-x}Al_x)_{0.5}P/In_{0.5}Al_{0.5}P$ superlattice, the $In_{0.5}(Ga_{1-x}Al_x)_{0.5}P$ layer has a fixed, steps, or gradient thickness profile.

Following the MQW 322 and electron reflector 323 in FIG. 3, a p-type $In_{0.5}(Ga_{1-x}Al_x)_{0.5}P$-based upper cladding layer 324 was used. The purpose of this p-type $In_{0.5}(Ga_{1-x}Al_x)_{0.5}P$ cladding layer 324 is for carrier injection into the active region 322 and an effect of carrier confinement in the active region 322. The Al composition in the $In_{0.5}(Ga_{1-x}Al_x)_{0.5}P$-based cladding layer 324 is 0.7<x<1 depending on the emission wavelength of the active layer 322 from red (650 nm) to yellow-green (570 nm) light emission. Thickness of the p-type cladding layer 324 should be thicker than the diffusion length of the injection carriers to prevent the carrier diffusion from the active region 322 into the cladding layer. In addition, the thickness of the p-cladding layer 324 needs to be larger than n-cladding layer 321 due to the diffusivity of p-type dopant like Zn or Mg during the growth of a LED. A typical thickness of the p-type $In_{0.5}(Ga_{1-x}Al_x)_{0.5}P$ upper cladding layer 324 is of ~0.7 to 1.5 $\mu$m. The doping level of the p-cladding layer 324 having a gradient or a two-steps doping profile within a range of the carrier concentration of $4*10^{17}/cm^2$ to $1*10^{18}/cm^2$ is applied in this invention. The light-output of the LED is strongly dependent on the doping level and profile of n-and p-type cladding layers. "Right" n- and p-type doping profiles in the $In_{0.5}(Ga_{1-x}Al_x)_{0.5}P$-based cladding layers 324 associated with a location of p-n junction in the active region 322 is essential for an efficient radiative recombination of electrons and holes in the MQW 322 upon current injection. Any overflow of individual injection carriers would decrease the efficiency of the emitting light due to the misalignment of the p-n junction and creation of nonradiative recombination centers by inter-diffusion of dopants into the active region 322. A gradient or step doping profile in the p-$In_{0.5}(Ga_{1-x}Al_x)_{0.5}P$-based cladding layer 324 with a thickness ratio of low/high doping level of ~0.1 to 0.3 is applied in the current application to insure precise carrier recombination without creating any large voltage drop or carrier overflow in the cladding layer. A good light emitting device requires a higher doping level of the n- and p-type cladding layer (~0.75 to $1*10^{18}/cm^2$) away from the multiple quantum wells 322 and a lower doping level of n- and p-type cladding layer (~0.4 to $0.75*10^{18}/cm^2$) near the multiple quantum well 322.

Following the p-type cladding layer, a thin intermediate layer of $In_{0.5}(Ga_{1-x}Al_x)_{0.5}P$ 325 with a doping concentration greater than that in the p-type cladding layer 324 is grown to insure a smooth transition and spreading of the injection carriers. To insure a high conductivity in the thin intermediate layer 325 of $In_{0.5}(Ga_{1-x}Al_x)_{0.5}P$ with current spreading on a plane perpendicular to the injection current, the composition of Al (x ~0.1–0.5) in this intermediate layer 325 is less than that in the p-type cladding layer 324 and lattice matched to the $In_{0.5}(Ga_{1-x}Al_x)_{0.5}P$ p-type cladding layer 324. The purpose of this intermediate current spreading layer 325 is designed with a thickness of 50–100 nm with a doping concentration higher than that in the p-type cladding layer 324 to create a pathway of low resistance on a plane perpendicular to the injection current. In addition, this intermediate $In_{0.5}(Ga_{1-x}Al_x)_{0.5}P$-based layer 325 has an energy gap larger than that in the active region 322 to avoid any absorption of light emitting from the active layer 322. Since the thickness of this intermediate layer is very thin and has a doping concentration higher than that in the p-cladding layer 324 and lower than that in the window layer 326, the intermediate layer 325 can act as a barrier for the current injection along the growth direction and a low resistance path for the current spreading on a plane perpendicular to the growth direction. The density of injection carriers in the device decreased due to a larger spreading area of light emitting. This leads to an increase on the efficiency of light emitting in the LED. The effect of current spreading contributing to the p-cladding layer 324 and active region 322 is controlled via the thickness, composition, and doping level of the p type $In_{0.5}(Ga_{1-x}Al_x)_{0.5}P$ barrier layer 325. A typical doping level of the intermediate $In_{0.5}(Ga_{1-x}Al_x)_{0.5}P$-based layer 325 is two to four times the doping level of the p-cladding layer 324 of $\sim 1-3\times 10^{18}/cm^2$ with a Al composition x of $\sim 0.2-0.4$ in the thin intermediate layer 325.

An approach used to maximize the performance of the $In_{0.5}(Ga_{1-x}Al_x)_{0.5}P$-based light emitting diode is to add a window layer 326 on top of the p-$In_{0.5}(Ga_{1-x}Al_x)_{0.5}P$-based cladding layer 324 (see FIG. 3). The idea of using GaP, AlGaP or AlGaAs as a window layer 326 for a function of current spreading in LED has been studied and claimed in an expired patent. In those cases, GaP or GaAsP has an energy bandgap transparent to the radiation from the active region 322 in LED. In the present invention, the LED structure including the p-type GaP, AlGaP, or AlGaAs window layer 326 is grown on a GaAs substrate 318 with a misorientation toward <111>A using "OMVPE" system. This idea is based on a patent in 1976 for epitaxially depositing AlGaAs, GaP or other III-V layers on a semiconductor surface. The growing surface has a misorientation from the major crystallographic plane. The epitaxial layers is grown by LPE or CVD epitaxial techniques to improve the smoothness of deposited films. In our invention, the III-V compounds of GaP, $Al_xGa_{1-x}P$ (x<0.1), and $Al_yGa_{1-y}As$ (0.5<y) grown epitaxially by OMVPE for better epitaxially control are applied as a window layer 326 for the current spreading in a LED with a emission wavelength from 650 nm to 560 nm. The GaP, $Al_xGa_{1-x}P$ (x<0.1), and AlyGalYAs (0.5<y) are applied in the current invention as a window layer 326 since they are transparent to the emission wavelength from 650 to 565 nm. In addition, a high doping capability in those materials is also an important factor for the selection of current spreading layer 326. The GaP, $Al_xGa_{1-x}P$ (x<0.1), and $Al_yGa_{1-y}As$ (0.5<y) can be doped heavily ($>2\times 10^{18}/cm^2$) to achieve a wider current spreading. The performance of the LED increases as the injection carriers (or doping level) increase in the window layer 326. This is due to the extension of current injection along a direction parallel to the layer surface with an increase on the doping level in the window layer. A typical doping level of the window layer 326 is in a range of $3-8\times 10^{18}/cm^2$. However, growth induced crystalline defects are generated in the window layers 326 for a doping level higher than $1\times 10^{19}/cm^2$ which may degrade the performance and life of the LED. The efficiency of the light emission also depends on the thickness of the window layer 326. The light extraction from the LED increases significantly as an increase on the thickness of the window layer 326 due to a wider current spreading area from the window layer 326 and a higher light extraction efficiency from the sides of the LED. The heavily p-doped ($>1\times 10^{18}/cm^2$) GaP, $Al_xGa_{1-x}P$ (x<0.1), and $Al_yGa_{1-y}As$ (0.7<y) window layers 326 with a thickness of 5–15 μm are adapted in the present invention.

Figure 4:
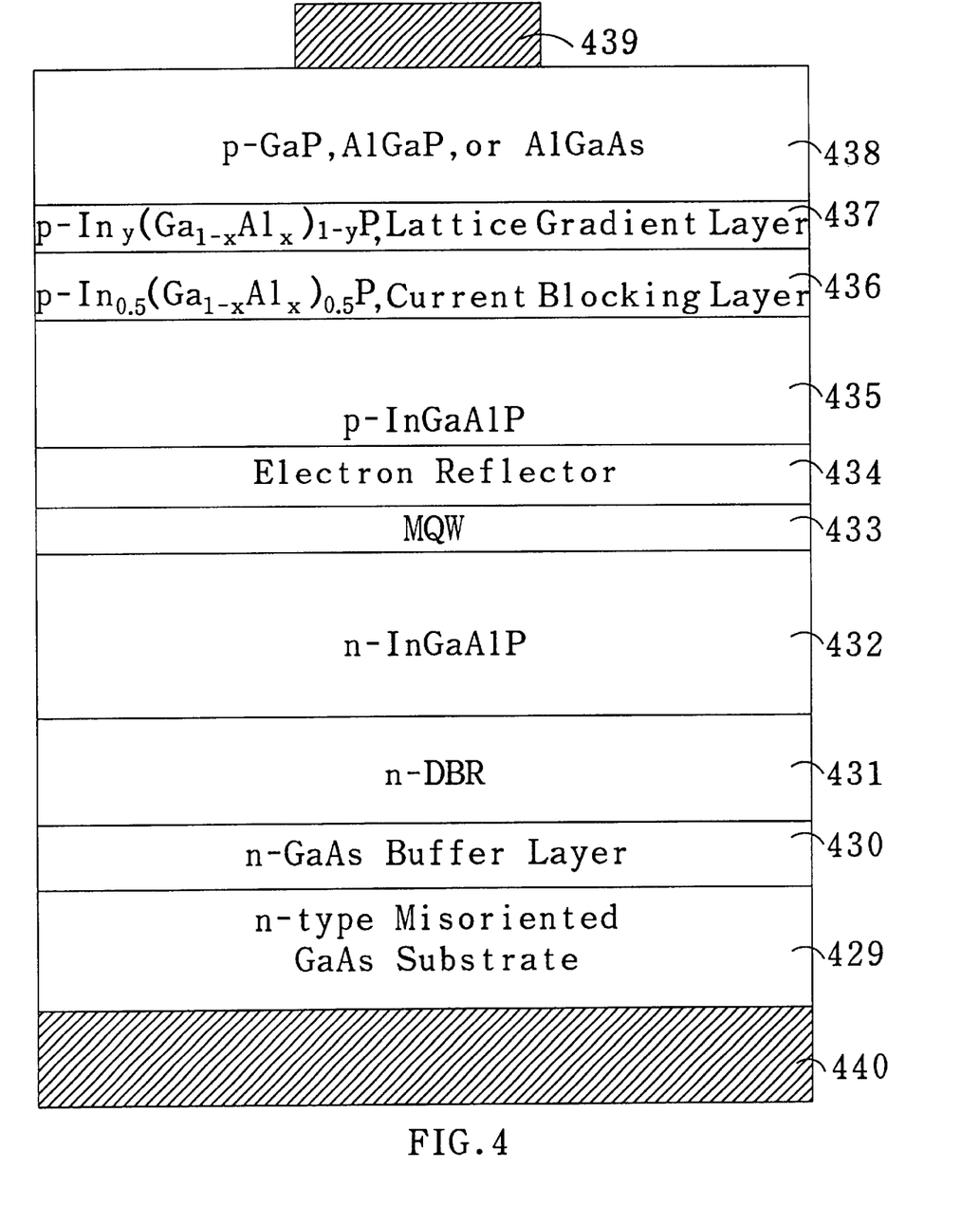
FIG. 4 shows a schematic cross-sectional diagram of a third embodiment of a light emitting diode according to the present invention.

FIG. 4, shows a schematic diagram of a device structure in light emitting diodes with a superlattice comprising $In_y(Ga_{1-x}Al_x)_{1-y}P$-based layers with a step or gradient (001) lattice constant. In this figure, the light extraction layer which comprises three layers from bottom to top are indicated as current blocking layer 436, lattice gradient 437, and window layer 438. The main purpose of these layers are used to block the current and spread the light emission more efficiently. The device structure comprises a DBR 431 and a quaternary $In_{0.5}(Ga_{1-x}Al_x)_{0.5}P$ alloy grown on an n-GaAs misoriented substrate 429. The device structure is constructed by a n-type GaAs buffer layer 430, a DBR 431, an n-$In_{0.5}(Ga_{1-x}Al_x)_{0.5}P$ lower cladding layer 432, a strain $In_y(Ga_{1-x}Al_x)_{1-y}P/In_{0.5}(Ga_{1-x}Al_x)_{0.5}P$ MQW 433, an $In_y(Ga_{1-x}Al_x)_{1-y}P$-based electron reflector 434, a p-$In_{0.5}(Ga_{1-x}Al_x)_{0.5}P$ upper cladding layer 435, a thin $In_{0.5}(Ga_{1-x}Al_x)_{0.5}P$ intermediate barrier layer 436 which is also called current blocking layer, a spuerlattice of p-$In_y(Ga_{1-x}Al_x)_{1-y}P$ alloy with a steps or gradient composition profile (or lattice constant) 437, a p-GaP or p-AlGaP current spreading layer (also called window layer) 438, in the present invention the current blocking layer (436), the lattice gradient layer (437), and the current diffusion layer (438) are combined to give a specific name as light extraction layer, a top metal contact 439, and a bottom metal contact 440.

In FIG. 4, a superlattice with a gradient (001) lattice constant in individual p-type $In_y(Ga_{1-x}Al_x)_{1-y}P$-based layer 437 is inserted between the intermediate current blocking layer 436 and p-type window layer 438. The p-type $In_y(Ga_{1-x}Al_x)_{1-y}P$-based superlattice 437 is applied in this invention to accommodate the difference in lattice constant between the $In_{0.5}(Ga_{1-x}Al_x)_{0.5}P$ alloy intermediate barrier layer 436 and the GaP-based window layer 438. The difference in lattice constant between the GaP window layer 438 and $In_{0.5}(Ga_{1-x}Al_x)_{0.5}P$ alloy barrier layer 436 is around 3.6% and the critical thickness of the GaP/$In_{0.5}(Ga_{1-x}Al_x)_{0.5}P$ heterostructure is around 5 to 10 nm. In this case, the initial growth of GaP-based epilayer is likely to form islands on the surface of the $In_{0.5}(Ga_{1-x}Al_x)_{0.5}P$-based thin intermediate layer 436. Upon the coalescence of those epitaxial islands, a high density of threading dislocations is generated in the film due to island coalescence and results in a rough surface of the GaP window layer 438. Those defects deteriorate the quality of the films and the performance of device. A high density of crystalline defects generated in the window layer 438 may act as light adsorption centers which may decrease the external efficiency of light emission and life time during device operation. In addition, those crystalline defects may increase the difficulty on device processing and packaging such as in contact fabrication and wire bonding. Therefore, a special care is required to grow the lattice mismatched GaP/$In_{0.5}(Ga_{1-x}Al_x)_{0.5}P$ heterostrucuture. A p-$In_y(Ga_{1-x}Al_x)_{1-y}P$-based superlattice 437 with a graded composition profile in Indium and Aluminum is claimed in this invention to accommodate the difference in lattice constant between the GaP window layer 438 and $In_{0.5}(Ga_{1-x}Al_x)_{0.5}P$-based layer 436. For the current application, the composition of Indium and Aluminum (denoted by x and y) in the $In_y(Ga_{1-x}Al_x)_{1-y}P$-based superlattice 437 is graded lineally to zero within 100 to 300 nm at a low growth rate of 0.05–0.2 μm/hour and a high V/III ratio of 100 or more. The doping concentration of this $In_y(Ga_{1-x}Al_x)_{1-y}P$-based grading layer 437 is maintained at a level of two to four times the doping concentration in the p-type $In_{0.5}(Ga_{1-x}Al_x)_{0.5}P$-based cladding layer 435.

Although only a preferred embodiment of this invention has been described and illustrated, many modifications and variations according to the principle of this invention can be made. It is requested that all changes and modifications that come within the spirit of this invention are to be protected.

What is claimed is:

1. A light emitting diode comprising:
   a bottom electrode contact;
   a GaAs substrate of first conductivity on said bottom electrode contact;
   a GaAs buffer layer on said GaAs substrate;
   a first InGaAlP layer on said GaAs buffer layer;
   an active layer on said first InGaAlP layer;
   a second InGaAlP layer of second conductivity opposite to said first conductivity on said active layer;
   a light extraction layer on said second InGaAlP layer, wherein said light extraction layer blocks and spreads currents from said second InGaAlP layer, and said light extraction layer comprises a current blocking layer on said second InGaAlP layer, wherein said current blocking layer comprises a $In_{0.5}(Ga_{1-x}Al_x)_{0.5}P$ layer of said second conductivity and thickness of said current blocking layer is about 10–100 nm; a lattice gradient layer on said current blocking layer to accommodate the difference in lattice constant between said current blocking layer and subsequent layer; and a window layer on said lattice gradient layer for the current spreading in said light emitting diode; and
   a top electrode contact layer on said light extraction layer.

2. The light emitting diode according to claim 1, wherein said substrate is misoriented with a tilting angel larger than 10° along <111>A.

3. A light emitting diode comprising:
   a bottom electrode contact;
   a GaAs substrate of first conductivity on said bottom electrode contact, wherein said substrate is misoriented with a tilting angel larger than 10° along <111>A;
   a first InGaAlP layer of said first conductivity on said substrate;
   an active layer on said first InGaAlP layer;
   a second InGaAlP layer on said active layer;
   a light extraction layer on said second InGaAlP layer wherein said light extraction layer blocks and spreads currents from said second InGaAlP layer; and
   a top electrode contact layer on said light extraction layer.

4. The light emitting diode according to claim 3, wherein said light extraction layer further comprises:
   a current blocking layer on said second InGaAlP layer, wherein said current blocking layer comprises a $In_{0.5}(Ga_{1-x}Al_x)_{0.5}P$ layer of said second conductivity and thickness of said current blocking layer is about 10–100 nm;
   a lattice gradient layer on said current blocking layer to accommodate the difference in lattice constant between said current blocking layer and the subsequent upper layer; and
   a window layer on said lattice gradient layer for the current spreading in said light emitting diode.

5. The light emitting diode according to claim 4, wherein, said current blocking layer comprises a $In_{0.5}(Ga_{1-x}Al_x)_{0.5}P$ layer of second conductivity which is about 2–4 times higher than said first InGaAlP layer in doping concentration.

6. The light emitting diode according to claim 4, wherein said current blocking layer has a mole composition x of Aluminum, where x is in the range of about 0.1 to 0.5 in said $In_{0.5}(Ga_{1-x}Al_x)_{0.5}P$-based alloy of second conductivity.

7. The light emitting diode according to claim 4, wherein said light extraction layer (includes three layers) has a band gap energy higher than said active region.

8. The light emitting diode according to claim 4, wherein said lattice gradient layer has a doping concentration that lies in the range between said second conductivity barrier layer and said window layer.

9. The light emitting diode according to claim 4, wherein said window layer has a step doping or gradient doping profile within the range of about $2*10^{18}/cm^2$ to $8*10^{18}/cm^2$.

10. The light emitting diode according to claim 9, wherein said doping concentration in said window layer near said window/cladding interface is lower than said doping concentration away from said window/cladding interface.

11. The light emitting diode according to claim 4, wherein said diode is epitaxially grown on said substrate in one chamber by using Organometallic Vapor-Phase Epitaxy (OMVPE) method at a temperature less than 750 degree celsius.

12. A light emitting diode comprising:
    a bottom electrode contact;
    a GaAs substrate of first conductivity on said bottom electrode contact, wherein said substrate is misoriented with a tilting angel larger than 10° along <111>A;
    a light re-emitting layer on said substrate;
    a first InGaAlP layer of said first conductivity on said light re-emitting layer;
    an active layer on said first InGaAlP layer, wherein said active layer comprises a strained $In_y(Ga_{1-x}Al_x)_{1-y}P/In_{0.5}(Ga_{1-x2}Al_{x2})_{0.5}P$ multi-quantum well structure having a <001> lattice constant of said $In_y(Ga_{1-x1}Al_{x1})_{1-y}P$ well larger than the <001> lattice constant of said misoriented GaAs substrate within the range of 0.2% to 0.6%;
    an $In_y(Ga_{1-x}Al_x)_{1-y}P$-based electron reflector layer having a barrier of $In_{0.5}Al_{0.5}P$ on said active layer, wherein the thickness of said barrier layer is about 20–40 nm;
    a second InGaAlP layer of a second conductivity opposite to said first InGaAlP layer of said first conductivity on said active layer;
    a light extraction layer on said second InGaAlP layer; and
    a top electrode contact on said light extraction layer.

13. The light emitting diode according to claim 12, wherein said diode is epitaxially grown on said substrate in one chamber by using Organometallic Vapor-Phase Epitaxy (OMVPE) method at a temperature less than 750 degree celsius.

14. The light emitting diode according to claim 12, wherein said light extraction layer comprises;
    a current blocking layer on said second InGaAlP layer, wherein said current blocking layer comprises a $In_{0.5}(Ga_{1-x}Al_x)_{0.5}P$ of said second conductivity and thickness is about 10–100 nm;
    a lattice gradient layer on said current blocking layer; and
    a window layer on said lattice gradient layer.

15. The light emitting diode according to claim 12, wherein the doping level in said light-re-emitting layer is larger than $2*10^{17}/cm^2$.

16. The light emitting diode according to claim 12, wherein said light re-emitting layer has a reflecting wavelength α near the wavelength β of said active region (α=β−5 nm or α=β+5 nm) with the same type of conducting carriers as said substrate.

17. The light emitting diode according to claim 12, wherein said light re-emitting layer is selected from the group consisting of AlAs/Al$_{x1}$Ga$_{1-x1}$As-based (x1≧0.5), In$_{0.5}$(Ga$_{1-x2}$Al$_{x2}$)$_{0.5}$P-based (x2≧0.1), and AlAs/In$_{0.5}$(Ga$_{1-x2}$Al$_{x2}$)$_{0.5}$P-based superlattice (x2>0.1).

18. The light emitting diode according to claim 17, wherein said composition x1 and x2 of Aluminum, for an emission wavelength larger than 630 nm, x1 is less than 0.55 and x2 is larger than 0.1, for an emission wavelength larger than 590 nm, x1 is less than 0.6 and x2 is larger than 0.2, for an emission wavelength larger than 570 nm, x1 is less than 0.7 and x2 is larger than 0.3.

19. The light emitting diode according to claim 12, wherein said light re-emitting layer is selected from the group consisting of AlAs/Al$_x$Ga$_{1-x}$As-based, In$_{0.5}$(Ga$_{1-x}$Al$_x$)$_{0.5}$P-based, and AlAs/In$_{0.5}$(Ga$_{1-x}$Al$_x$)$_{0.5}$P-based superlattice with a difference in the reflective index of the individual stacking layer is no less than 0.15.

20. The light emitting diode according to claim 12, wherein the mismatch between said light re-emitting layer and said substrate is less than 0.3%.

21. The light emitting diode according to claim 12, wherein said first InGaAlP layer has a gradient doping profile from about $0.4*10^{18}$/cm$^2$ to $1*10^{18}$/cm$^2$.

22. The light emitting diode according to claim 12, wherein said light extraction layer comprises;
   a current blocking layer on said second InGaAlP layer, wherein said current blocking layer comprises a In$_{0.5}$(Ga$_{1-x}$Al$_x$)$_{0.5}$P layer of said second conductivity and thickness of said current blocking layer is about 10–100 nm;
   a lattice gradient layer on said current blocking layer to accommodate the difference in lattice constant between said current blocking layer and the subsequent upper layer; and
   a window layer on said lattice gradient layer for the current spreading in said light emitting diode.

23. The light emitting diode according to claim 22, wherein, said current blocking layer comprises a In$_{0.5}$(Ga$_{1-x}$Al$_x$)$_{0.5}$P layer of second conductivity which is about 2–4 times higher than said first InGaAlP layer in doping concentration.

24. The light emitting diode according to claim 22, wherein said current blocking layer has a mole composition x of Aluminum, where x is in the range of about 0.1 to 0.5 in said In$_{0.5}$(Ga$_{1-x}$Al$_x$)$_{0.5}$P-based alloy of second conductivity.

25. The light emitting diode according to claim 22, wherein said current blocking layer has a band gap energy higher than said active region.

26. The light emitting diode according to claim 22, wherein said lattice gradient layer has a doping concentration that lies in the range between said second conductivity barrier layer and said window layer.

27. The light emitting diode according to claim 22, wherein said window layer has a step doping or gradient profile within the range of about $2*10^{18}$/cm$^2$ to $8*10^{18}$/cm$^2$.

28. The light emitting diode according to claim 22, wherein said doping concentration in said window layer near said window/cladding interface is lower than said doping concentration away from said window/cladding interface.

* * * * *